(12) United States Patent
Dickey et al.

(10) Patent No.: US 7,523,780 B2
(45) Date of Patent: Apr. 28, 2009

(54) HIGH DENSITY ELECTRONIC COOLING TRIANGULAR SHAPED MICROCHANNEL DEVICE

(75) Inventors: James Todd Dickey, El Segundo, CA (US); Tung Ting Lam, Fullerton, CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 11/231,192

(22) Filed: Sep. 19, 2005

(65) Prior Publication Data

US 2006/0011334 A1 Jan. 19, 2006

(51) Int. Cl.
*H05K 7/20* (2006.01)
(52) U.S. Cl. .................. 165/80.4; 361/699; 165/170
(58) Field of Classification Search .............. 165/80.4, 165/168, 170; 361/699
See application file for complete search history.

(56) References Cited

U.S. PATENT DOCUMENTS

| | | | | |
|---|---|---|---|---|
| 4,421,702 A | * | 12/1983 | Oda et al. | 264/631 |
| 4,894,709 A | * | 1/1990 | Phillips et al. | 257/714 |
| 5,811,062 A | * | 9/1998 | Wegeng et al. | 422/129 |
| 6,000,467 A | * | 12/1999 | Tokizaki et al. | 165/134.1 |
| 6,200,536 B1 | * | 3/2001 | Tonkovich et al. | 422/177 |
| 6,301,931 B1 | * | 10/2001 | Swierkowski et al. | 65/36 |
| 6,381,846 B2 | * | 5/2002 | Insley et al. | 29/890.039 |
| 6,535,533 B2 | * | 3/2003 | Lorenzen et al. | 372/34 |
| 6,770,183 B1 | * | 8/2004 | Hencken et al. | 204/600 |
| 2002/0184894 A1 | * | 12/2002 | Batchelor et al. | 62/3.3 |
| 2003/0116503 A1 | * | 6/2003 | Wang et al. | 210/660 |
| 2003/0213580 A1 | * | 11/2003 | Philpott et al. | 165/46 |
| 2004/0052929 A1 | * | 3/2004 | Kirby et al. | 427/58 |
| 2005/0274506 A1 | * | 12/2005 | Bhatti et al. | 165/177 |

* cited by examiner

*Primary Examiner*—Allen J Flanigan
(74) *Attorney, Agent, or Firm*—Derrick Michael Reid

(57) ABSTRACT

An isosceles triangular cross section shaped microchannel-cooling device conducts a working fluid for the removal of heat from a heat source. The triangular shaped microchannel provides an increased thermal transport coefficient for improved heat transport with an improved mass flow rate. The microchannel-cooling device is well suited for removing heat from electronics, semiconductor components, and systems.

10 Claims, 2 Drawing Sheets

MICROCHANNEL ALTERNATING COOLING DEVICE

MICROCHANNEL ALIGNED COOLING DEVICE

MICROCHANNEL ALTERNATING COOLING DEVICE

COOLING DEVICE FABRICATION PROCESS

MICROCHANNEL ALIGNED COOLING DEVICE

HIGH DENSITY ELECTRONIC COOLING TRIANGULAR SHAPED MICROCHANNEL DEVICE

FIELD OF THE INVENTION

The invention relates to the field of electronics and semiconductor processing. More particularly, the present invention relates to the formation and use of fluid transport microchannels for cooling electronics and semiconductor components.

BACKGROUND OF THE INVENTION

The packing density of electronic components on chips continues to rise, thereby increasing the energy dissipation per unit surface area. In order to decrease the resulting high temperatures, fluid filled microchannel devices are used for thermal energy transport. Previous microchannels have had limited channel shapes or configuration of shapes to increase the heat removal capacity. Past investigations of microchannel with forced convective flows have used rectangular channel shapes. Normal heat removal rates are on the order of 3.4 W/cm$^2$-$°$ C. This low heat transfer rate forces electronic components to operate at high temperatures with reduced operational life.

The capability of cooling technology for leading-edge microelectronic products is being pushed to the limit due to the ever-increasing heat flux generating components mounted on high-density electronic chips. In order to remove the large heat fluxes generated by these components, two-phase devices, such as heat pipes and two-phased pumped fluid loops with a single microchannel, are being considered. Microchannel heat sinks for high heat flux electronic cooling has been used. The heat removal capability of such microchannel devices is based on the large heat transfer surface-to-volume ratio of microchannels. High single-phase heat transfer coefficients can be achieved at the expense of enormous pressure drops in microchannels. Two-phase flow microchannel heat sinks are capable of removing heat fluxes generated by high density packages in excess of 200 W/cm$^2$. The major disadvantages associated with the use of two-phase cooling devices is that the system needs to avoid instability when operating close to the critical heat flux point and needs to minimize surface temperature gradients between the microchannel and the upper surface of the heat sink.

The single-phase loops have incorporated methanol, refrigerant-124, FC-87, and water. With water as the working fluid, a heat flux of 790 W/cm$^2$ could be dissipated in a rectangular grooved microchannel. The corresponding substrate temperature rise was 71$°$ C. above the input water temperature. This represented a maximum downstream thermal resistance of about 0.09$°$ C./W for a 1.0 cm$^2$ heated area. Both laminar and turbulent flow regimes offer a method to lower the total thermal resistance of a microchannel. Two analytical approaches have been employed to evaluate the velocity profile of microchannel flows. One method is a microanalysis method in which the microchannels are independently investigated. The second method is a macroanalysis method that simulates the microchannel stream as a flow through a porous media and typically incorporates a volume-averaging technique and a form of the Darcy equation. The macroanalysis method requires a uniform cross section. Thus, any geometric channel shape that would cause porosity to be a function of one or more coordinate axes is not an appropriate usage of the porous material analysis assumption. Microchannel heat removal processes and simulations have been used to accurately model and simulate the volume flow rates for heat removal performance verification.

Microprocessor components, such as silica chips, are generating high heat flux levels. This corresponds to high temperatures and the corresponding reliability issues for these devices. Optimization of rectangular shaped microchannel grooves utilizing water as the pumped single phase fluid have been used in order to decrease the temperature of microprocessor components. Heat transfer solutions from rectangular microchannel shapes for heat sinks have limited energy transfer rates. While extensive work exists for the rectangular microchannel cross sectional area, the rectangular microchannel cross sectional area offers increased packing density with large flow rates but with limited heat transport capabilities. These and other disadvantages are solved or reduced using the invention.

SUMMARY OF THE INVENTION

An object of the invention is to provide cooling using microchannels.

An object of the invention is to provide a low average surface temperature through high heat energy transport of a microchannel for cooling electronic components.

Yet another object of the invention is to cool electronic components by forming isosceles triangular microchannels through which flows a cooling fluid.

The invention is directed to a microchannel pumped fluid loop having triangular channels arranged in a sawtooth configuration. This orientation maximizes the absorption of thermal energy by the flowing working fluid. The microchannel surface area to microchannel volume ratio, and, the mass flow rate of the pumped fluid determines the heat transfer coefficient. The sawtooth configuration offers an improvement to 4.5 W/cm$^2$-C$°$ for the heat transfer coefficient for heat removable capability with the triangular microchannel geometry. This large increase in the heat transfer coefficient allows high heat removal from electronic components with operation at a substantially lower temperature offering extended life of the electronic components. The channel packaging takes advantage of the high packing density of the microchannels for providing a large surface to volume ratio for-solid to fluid heat transfer. The microchannels have a large heat conduction area that effectively spreads heat throughout the device resulting in low surface temperatures. The sawtooth configuration allows for high heat conduction through an interstitial area. This high heat conduction enables heat to travel freely to the entire convective surface area. This surface area is juxtaposed between the solid portion of the device and the fluid carrying flow microchannels. The triangular shape allows for a large number of microchannels being efficiently packaged together thereby enabling a high mass flow rate of the pumped fluid. The fluid transport enables removal of thermal energy from the electronic component or system. The higher the mass flow rate, the greater heat removal of the device with a subsequently lower resulting temperature. The velocity distribution of the fluid has a maximum flow rate close to the heat flux surfaces for providing a high heat removal rate. The surface area to volume ratio of the microchannel is large so that heat is effectively absorbed into and transported by the working fluid with low fluid frictional losses. The triangular microchannel configuration increases the packaging density of fluid transport channels for increased heat transport capacity of electronic systems. The triangular microchannel configuration increases the heat transport capacity while reducing differential temperatures for cooler running components at uniform temperatures. This reduced and uniform temperature results in an increase in reliability and component life. These and other advantages will become more apparent from the following detailed description of the-preferred embodiment.

DETAILED DESCRIPTION OF THE PREFERRED EMBODIMENT

Figure 1:
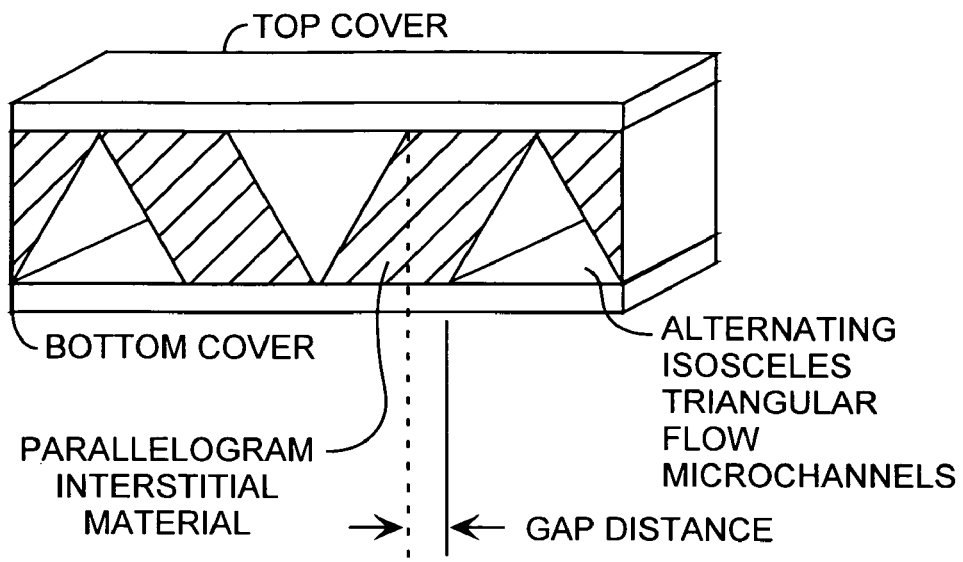
FIG. 1 is a diagram of a microchannel alternating cooling device.

An embodiment of the invention is described with reference to the figures using reference designations as shown in the figures. Referring to FIG. 1, a microchannel alternating cooling device includes alternating isosceles triangular flow microchannels. Between the alternating triangular microchannels are formed alternating parallelogram interstitial material. The microchannels and interstitial material are disposed between a top cover and a bottom cover. The top and bottom covers are preferably made of glass, but other covering materials may be used as well. Alternating upwardly and downwardly pointing microchannels are separated by a gap distance.

Figure 3:
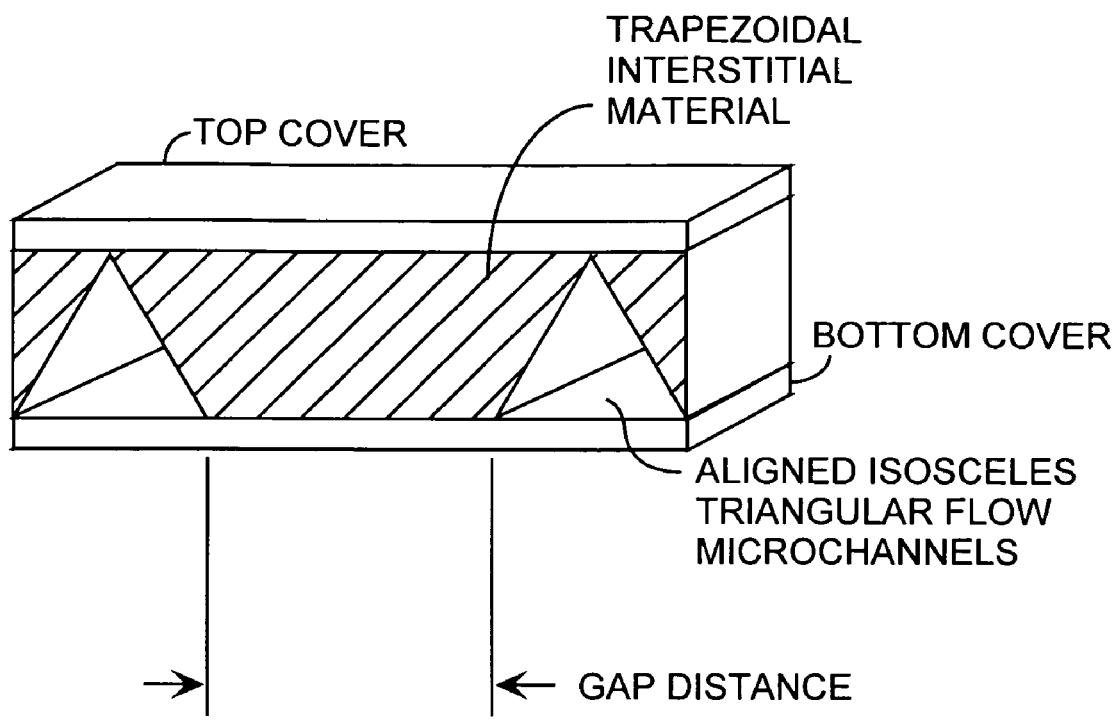
FIG. 3 is a diagram of a microchannel aligned cooling device.

Referring to FIG. 3, a microchannel aligned cooling device includes a plurality of aligned isosceles triangular flow microchannels. Between the aligned triangular microchannels are formed trapezoidal interstitial material. The aligned microchannels and interstitial material are disposed between a top cover and a bottom cover. The top and bottom covers are preferably made of glass, but other covering materials may be used as well. The aligned and unidirectionally pointing microchannels are separated by a gap distance.

Figure 2:
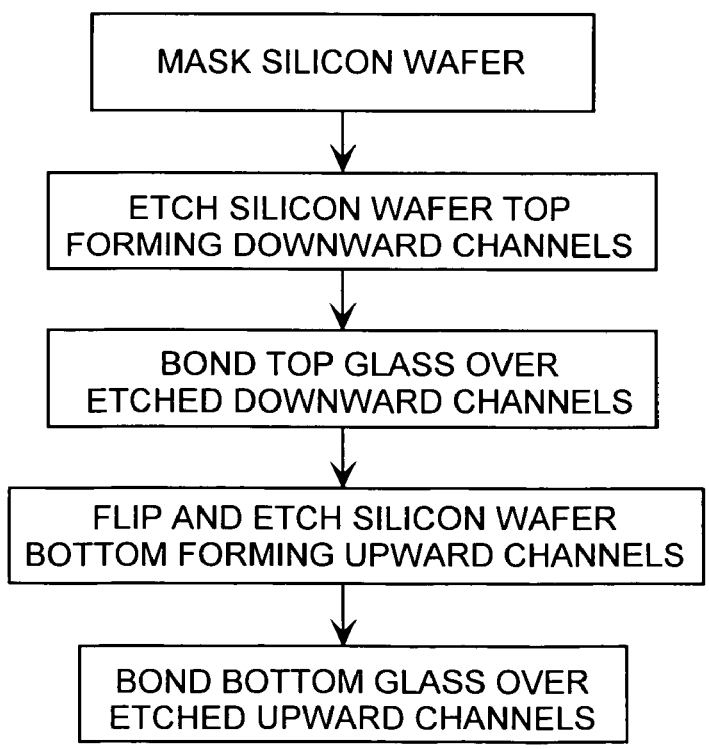
FIG. 2 is a flow diagram of a cooling device fabrication process.

Referring to FIGS. 1 and 2, the triangular microchannels can be formed using conventional semiconductor processes and device fabrication process. The fabrication process may start with a silicon wafer that is firstly masked and then etched downward forming every other downwardly pointing triangular microchannel. The top cover glass is then bonded over openings of the opened downwardly pointing microchannels. The wafer is then flipped and etched downward again, in a repeat process, for forming the upwardly extending microchannels. The bottom cover glass is then bonded over the openings of the upwardly extending microchannels. The triangular microchannels form a sawtooth configuration with alternating upwardly and downwardly pointing triangular microchannels having a regular gap distance. Current etching techniques reduce surface roughness to a minimum and readily allow for the creation of equilateral triangular grooves. The geometry of the microchannel triangular grooves can be arranged in different triangular configurations, including upwardly pointing, downwardly pointing, and alternately pointing configurations. In all three cases, the cross sectional area of the microchannel groove is triangular, and preferably has an isosceles triangle cross-section.

A seminumerical analysis of the effects of design parameters on the thermal performance of triangular groove microchannels can be used to demonstrate functional utility. The aspect ratio, cross sectional shape, channel configuration, and the effective thermal resistivity of the integrated system consisting of the cooling device and attached electronics, are parameters that determine the effective heat transfer of the microstructure. The sawtooth pattern yields the highest convection coefficient at 4.46 W/° C.-cm². Thus, the analysis is applied to the triangular geometry for a single-phase pumped fluid loop with water as the working fluid with the substrate being silica with a maximum pressure drop of 206.8 kPa that has been identified as a limit. Parametric analysis can be used to determine the optimal channel size and the gap distance between the channels. The heat transfer coefficient, based on the average temperature of the substrate along the top or bottom cover glass, for various configurations can be computed for identifying the optimal geometry of the microchannel heat sink. A single-phase flow correlation can predict thermal operations for determining the liquid velocity distribution within the microchannels. The velocity distribution in a fully developed laminar flow in an equilateral triangle having a side, a, can be described by a velocity distribution equation.

$$u(y, z) = \frac{-d\hat{p}/dx}{2\sqrt{3}\,a\mu}\left(z - \frac{a\sqrt{3}}{2}\right)(3y^2 - z^2)$$

In the velocity distribution equation, u is the velocity in the flow direction along the height of a microchannel in cm/s, d$\hat{p}$/dx is the pressure drop along the length of the triangular channel where $\hat{p}$ is the pressure in Pa. The term, a, is the side dimension of equilateral triangle in microns μm. The term μ is the viscosity in Pa-s. The term x is the height direction of a microchannel. The term y is the length of a microchannel. The term z is the width of a microchannel. The terms x, y, and z are Cartesian coordinates. The total volume flow rate Q in cm³/s is given by a flow equation.

$$Q = \frac{a^4\sqrt{3}}{320\mu}\left(-\frac{d\hat{p}}{dx}\right)$$

A constant heat flux of 100 W/cm² is applied uniformly to the cover glass for simulating an electronic heat source. The working fluid enters the microchannel at 0° C. The heat dissipated from the electronic components on the cover glass is modeled as applied uniformly over the cover glass. The triangular microchannel sides can be varied, such as between 60 μm to 439 μm. The 439 μm channel allows for a 380 μm channel height. The gap distances between microchannels may vary from 0 μm to 60 μm. The gap distance has an effect on the average surface temperature. A fin effect is a function of the average surface temperature for triangular grooves with sides larger than 160 μm. Two competing factors that give rise to the fin effect are the change in conductivity of the device and the variation of surface area for receiving the applied heat flux. Due to the increase in gap distance, the silica interstitial constituent of the device increases for allowing the heat flux applied at the surface of the silica to travel more effectively to the entire microchannel flow surface and then be convected into the working fluid. Thus, the resulting drop in the average surface temperature is a function of the gap distance that may be preferably between 1 μm and 10 μm. An increased gap distance provides for increased total energy input into the device. The variation of average surface temperature changes with the mass flow rate. An increase in the length of the microchannel increases the heat transport to the flow channel. However, at large dimensions, the fin effect overwhelms the device operation, and, the average surface temperature rises. The fin effect becomes more pronounced as the channel dimensions grow. The change in the average surface temperature, based on a 0° C. inlet temperature, is on the order of 25% when the channel size grows from 60 μm to 80 μm. The same size variation represents an increase in the mass flow rate of 40%. The effect of the increased mass flow rate is countered by the increase in distances required to transport the energy to all surface areas of the microchannel. Hence, the corresponding percentage surface temperature drop is less than the 40% increase in the mass flow rate.

The average convective heat transfer coefficient for the microchannel device is defined by a heat transfer coefficient equation.

$$\bar{h} = q_{in}/(T_{s,avg} - T_i)$$

In the coefficient equation, $\bar{h}$ is the heat transfer coefficient in W/° C.-cm$^2$, $q_{in}$ is the applied heat flux per unit area in W/cm$^2$ of the heat source, $T_{s,avg}$ is the average surface temperature in ° C., and $T_i$ is the inlet temperature of the coolant in ° C. The change in the heat transfer coefficient is a function of triangle size and gap distance and the variation of groove layout. In general, the heat transfer coefficient of the chip decreases as the gap distance between microchannels increases. The heat transport capability reaches an optimal value for a small gap distance configuration due to convection domination of the microchannels.

The influence of the convective contribution to heat transport diminishes as the heat conduction dominates for large gap distances that are orthogonal to the length of the microchannels. As the gap distance increases, the heat transfer efficiency increases due to an increase in heat transfer area and conduction along the microchannels. Hence, there exists an optimal value for the microchannel size and the gap distance in the design of the microchannel for high density electronic cooling. Hence, the microchannel device performance is dependent upon many factors including conduction through the silica and through the working fluid, convection into the fluid filled channel, fluid velocity distribution within the microchannel, and the microchannel shape. Optimization of the microchannel configuration is dependent upon transporting the heat effectively into the fluid flow of the microchannel and transporting the fluid out of the device. The microchannel has a short distance from the convective surface having a high heat flux, to the highest fluid velocity point within the microchannel fluid flow.

A thermal network model, based on the mass flow rate and specific heat of the fluid, can be generated for the substrate and the channel. Various SINDA subroutines can be used to solve the heat transfer problem. The subroutine SNSOR within the SINDA analyzer is used to obtain the steady-state solution of the governing nonlinear partial differential equation using a network equation.

$$\sum_{j=1}^{n} G_{ij}(T_j - T_i) + \sum_{j=1}^{n} A_i F_{ij}(T_j^4 - T_i^4) + Q_i = 0$$

In the network equation, the term A is the cross sectional area of the microchannel in μm$^2$, F is the radiation view factor, G is the linear conductance in W/° C., n is the total number of thermal nodes, Q is the heat source in watts W, i is a subscripts for node being measured, j is an attached node, and $T_i$ is a nodal temperature in ° C. The analysis uses a constant heat flux of 100 W/cm$_2$ that is applied uniformly to the cover glass as the water enters the microchannel at 0° C. The triangular microchannel sides are 439 μm for a 380 μm channel height with gap distances between the microchannels varying from 0 μm to 60 μm.

The gap distance has an effect on the average surface temperature. The change in average surface temperature, based on a 0° C. inlet temperature, is on the order of 25% when the channel size grows from 60 μm to 80 μm. The same size variation represents an increase in the mass flow rate of 40%. The effect of the increased mass flow rate is countered by the increase in the distances required to transport the energy to all surface areas of the microchannel. Thus, the corresponding surface temperature drop is less than the 40% increase in the mass flow rate. Other factors, such as larger length scales required to conduct energy into the fluid interior influence the ability of the system to absorb energy.

In general, the heat transfer coefficient of the device decreases as the gap distance between channels becomes larger. This is due to the increase distance required to transport the applied thermal energy from the cover glass to the flow channel. As the size of the channel increases, the thermal energy removal is enhanced by convection due to the enlargement of the channel cross-sectional area for increased fluid flow and heat transfer. For example, channel sizes may vary from 60 μm to 200 μm. However, beyond the 200 μm size, the combination of channel size and gap width provides less capability for convective heat transfer. The variation in convective energy transport capacity is more pronounced for a triangular microchannel with small gap distance, for example, between 5 μm to 10 μm for a 200 μm channel height, due to the restricted energy flow between microchannels and through the interstitial material. The smaller gap dimension retards energy transport into the lower channel regions. The retarded energy transport effectively reduces the convective capacity of the device. The heat transfer coefficient reaches an optimal value for a 200 μm microchannel height with a 6 μm gap distance. As the channel size exceeds 200 μm, the heat transfer coefficient is lower initially for small gap distances, but increases rapidly as the gap distance increases.

The heat transport capability reaches an optimal value for a small gap distance configuration due to convection domination of the microchannel device. The effect of convective heat transport diminishes as the heat conduction dominates along the microchannel for large gap distances. As the gap distance increases, the heat transfer efficiency increases due to an increase in the heat transfer area and conduction across the width of the microchannel. Hence, there exists an optimal value for the channel size and the gap distance of microchannel for high density electronic cooling.

With a 300 μm sided equilateral triangle, with a gap distance progressing from 1 μm to 40 μm, the axial location is 0.5 cm. The zero height location is the surface at which the heat flux is applied at the midpoint of the channel. The energy is restricted from entering the lower portion of the device by the small gap distance. This is observable from the lower temperature and temperature gradient exhibited within the region of a 150 μm height and a 90 μm width as compared to the upper thermal energy application region. A small percentage, less than 25%, of the applied heat flux is absorbed in the lower region of the microchannel for the 1 μm gap distance. As the gap distance increases, more of the lower channel portion engages in the absorption of the applied thermal energy. For gap distances above 10 μm, little variation is had in the overall uniformity of temperature or temperature gradient within the silica substrate. Likewise, temperature gradients throughout the substrate immediately adjacent to the fluid channel have marked similarity. However, the increase in gap distance also carries the increase in the thermal energy applied to the device system. Thus, an overall increase in the device temperature is experienced as the gap distance increase beyond 10 μm. When more of the flow surface area is closer to the applied heat flux surface, larger temperature gradients are created at fluid flow interface at the surface of the microchannel. The highest fluid flow velocity is close to the surface of the microchannel. Thus, energy is removed more efficiently close to the surface of the microchannel resulting in higher temperature gradients for improved thermal energy removal.

The present invention is directed to triangular microchannels for efficient transport of heat energy. The smaller the microchannels, for example, those microchannel less than 160 μm, the fluid is more restricted along the microchannel for reduced thermal transport. As the microchannels grows excessive in size, some portions, specifically the corners of the microchannels, have comparatively large thermal energy flow restrictions of the fin effect from the upper thermal energy application region to the lower microchannel portions. Between excessively small and excessively large microchannel sizes, there is an optimum thermal transport performance. Various triangular microchannel device designs can be used for improved thermal energy transport from semiconductor components and systems. Those skilled in the art can make enhancements, improvements, and modifications to the invention, and these enhancements, improvements, and modifications may nonetheless fall within the spirit and scope of the following claims.

What is claimed is:

1. A device for removing thermal energy from a system, the device comprising, microchannels each extending by a length and having a triangular cross section for receiving and conducting a working fluid, the triangular cross section defining a triangle having three equal sides, a cover for enclosing the microchannels for conducting the thermal energy from the system, and interstitial material surrounding the microchannels, the interstitial material conducting the thermal energy from the cover to the working fluid in the microchannels, the interstitial material having a trapezoidal cross section, the microchannels being aligned to each other and point in a same direction, the device made by a process comprising the steps of, etching the triangular cross section into a substrate comprising the interstitial material, and disposing the cover over the microchannels for forming and encapsulating the microchannels.

2. The device of claim 1, wherein,
the working fluid is a refrigerant.

3. The device of claim 1 wherein,
the working fluid is water.

4. The device of claim 1 wherein,
the triangular cross section has a height of less than three hundred and seventy microns.

5. The device of claim 1 wherein the microchannels,
the side length is between 60 μm to 439 μm, and
the gap distance is between 1 μm and 40 μm.

6. A device for removing thermal energy from a system, the device comprising, microchannels, each of the microchannels extending by a length and in parallel, each of the microchannels having a triangular cross section for concurrently receiving and conducting a working fluid, the triangular cross section defining a triangle having three equal sides, a cover for enclosing the microchannels for conducting the thermal energy from the system, and interstitial material surrounding the microchannels and disposed between each successive pair of the microchannels for forming a gap distance between each successive pair of the microchannels, the interstitial material conducting heat from the cover to the working fluid in the microchannels, the interstitial material having a parallelogram cross section, each of the microchannels being aligned to each other and alternately point in alternating directions, the device made by a process comprising the steps of, etching the triangular cross section into a substrate comprising the interstitial material, and disposing the cover over the microchannels for forming and encapsulating the microchannels.

7. The device of claim 6 wherein,
the gap distance is less than sixty microns.

8. The device of claim 6 wherein,
the triangular cross section has a height of less than three hundred and seventy microns.

9. The device of claim 6 wherein,
the cover comprises a top cover and a bottom cover for respectively enclosing the alternating microchannels for containing the working fluid within the microchannels during flow of the working fluid through the microchannels.

10. The device of claim 6 wherein the microchannels,
the side length is between 60 μm to 439 μm, and
the gap distance is between 1 μm and 40 μm.

* * * * *